US010193104B2

(12) United States Patent
Xu et al.

(10) Patent No.: US 10,193,104 B2
(45) Date of Patent: Jan. 29, 2019

(54) ORGANIC LIGHT-EMITTING DIODE STRUCTURE AND FABRICATION METHOD THEREOF, RELATED DISPLAY PANEL, AND RELATED DISPLAY DEVICE

(71) Applicant: BOE TECHNOLOGY GROUP CO., LTD, Beijing (CN)

(72) Inventors: Kai Xu, Beijing (CN); Xinwei Gao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 20 days.

(21) Appl. No.: 15/325,204

(22) PCT Filed: Oct. 29, 2015

(86) PCT No.: PCT/CN2015/093195
§ 371 (c)(1),
(2) Date: Jan. 10, 2017

(87) PCT Pub. No.: WO2017/070892
PCT Pub. Date: May 4, 2017

(65) Prior Publication Data
US 2017/0294624 A1    Oct. 12, 2017

(51) Int. Cl.
*H01L 51/52* (2006.01)
*H01L 27/32* (2006.01)
(Continued)

(52) U.S. Cl.
CPC ...... *H01L 51/5265* (2013.01); *H01L 27/3209* (2013.01); *H01L 27/3244* (2013.01);
(Continued)

(58) Field of Classification Search
CPC ............. H01L 51/5265; H01L 27/3244; H01L 51/5206; H01L 51/504; H01L 51/5221;
(Continued)

(56) References Cited

U.S. PATENT DOCUMENTS 8,866,131 B2 * 10/2014 Ishihara .............. H01L 51/5265
257/40
2008/0108270 A1    5/2008 Hama
(Continued)

FOREIGN PATENT DOCUMENTS

CN    1604703 A    4/2005
CN    1717140 A    1/2006
(Continued)

OTHER PUBLICATIONS

The World Intellectual Property Organization (WIPO) International Search Report for PCT/CN2015/093195 dated Jul. 27, 2016 pp. 1-12.
(Continued)

*Primary Examiner* — Dung Le
(74) *Attorney, Agent, or Firm* — Westerman, Hattori, Daniels & Adrian, LLP

(57) ABSTRACT

The present disclosure provides an organic light-emitting diode device (OLED) structure for compensating blue light emission. The OLED structure includes a substrate with a thin-film transistor layer, the substrate being substantially transparent; and a first electrode layer on the substrate, the first electrode being substantially transparent; a first light-emitting layer on the first electrode layer with one or more light-emitting portions for emitting light for compensating blue light. The OLED structure also includes a charge generation layer (CGL) with a reflective portion, the CGL on the first light-emitting layer, the reflective portion having a transmission rate for light emitted by the first light-emitting layer; a second light-emitting layer on the CGL with one or more light-emitting portions for emitting the blue light; and a second electrode layer with a reflectivity on the second light-emitting layer.

23 Claims, 2 Drawing Sheets

(51) Int. Cl.
  *H01L 51/56* (2006.01)
  *H01L 51/50* (2006.01)
  *H01L 51/00* (2006.01)

(52) U.S. Cl.
  CPC ........ *H01L 51/504* (2013.01); *H01L 51/5056* (2013.01); *H01L 51/5072* (2013.01); *H01L 51/5088* (2013.01); *H01L 51/5092* (2013.01); *H01L 51/5206* (2013.01); *H01L 51/5221* (2013.01); *H01L 51/5278* (2013.01); *H01L 51/56* (2013.01); *H01L 51/006* (2013.01); *H01L 51/0058* (2013.01); *H01L 51/5036* (2013.01); *H01L 2251/301* (2013.01); *H01L 2251/308* (2013.01); *H01L 2251/558* (2013.01)

(58) Field of Classification Search
  CPC ............. H01L 51/5092; H01L 51/5088; H01L 51/5056; H01L 51/5072; H01L 51/56; H01L 51/5278
  See application file for complete search history.

(56) References Cited

U.S. PATENT DOCUMENTS

| | | |
|---|---|---|
| 2009/0146560 A1 | 6/2009 | Kim |
| 2014/0246663 A1* | 9/2014 | Kambe ............... H01L 51/5278 257/40 |
| 2017/0338285 A1* | 11/2017 | Song ................... H01L 51/5278 |

FOREIGN PATENT DOCUMENTS

| | | |
|---|---|---|
| CN | 1819305 A | 8/2006 |
| CN | 101132020 A | 2/2008 |
| CN | 102074656 A | 5/2011 |
| CN | 103050633 A | 4/2013 |
| CN | 103107288 A | 5/2013 |
| CN | 103872068 A | 6/2014 |

OTHER PUBLICATIONS

State Intellectual Property Office of the P.R.C (SIPO) Office Action 1 for 201580000827.5 dated Sep. 18, 2016 pp. 1-12.

* cited by examiner

ORGANIC LIGHT-EMITTING DIODE STRUCTURE AND FABRICATION METHOD THEREOF, RELATED DISPLAY PANEL, AND RELATED DISPLAY DEVICE

This PCT patent application is a national phase entry under 35 U.S.C. § 371 of International Application No. PCT/CN2015/093195, filed on Oct. 29, 2015, the entire contents of which is incorporated by reference herein.

FIELD OF THE INVENTION

The present invention generally relates to the display technologies and, more particularly, relates to an organic light-emitting diode (OLED) structure and fabrication method thereof, related display panels, and related display devices.

BACKGROUND

Active matrix organic light-emitting diode (AMOLED) display panels have been widely used in display devices, such as smart phones. Compared to conventional liquid crystal display (LCD) panels, AMOLED display panels have advantages such as shorter response time, higher brightness contrast, and wider viewing angles. Display devices incorporating AMOLED display panels are preferred in various display products.

In an AMOLED display panel, the organic light-emitting material used for emitting blue light often has issues including low efficiency and short service time, which have been a bottleneck for developing AMOLED products. Conventionally, increasing the area of the blue pixels in an AMOLED display panel may increase the intensity and proportions of blue light and extend the service time of the device. Nevertheless, it is still desirable to improve the efficiency and service time of the blue pixels.

BRIEF SUMMARY OF THE DISCLOSURE

The present disclosure provides a tandem bottom-emitting OLED structure and fabrication method thereof, and related display device. By using the disclosed OLED structure, the intensity of the blue light can be increased, and the chromaticity coordinates of the OLED structure may be improved. Further, the service time of the blue pixels and the service time of the display device can be extended.

One aspect of the present disclosure includes an organic light-emitting diode device (OLED) structure for compensating blue light emission, comprising a substrate with a thin-film transistor (TFT) layer, the substrate being substantially transparent; a first electrode layer on the substrate, the first electrode being substantially transparent; and a first light-emitting layer on the first electrode layer with one or more light-emitting portions for emitting light for compensating blue light. The OLED structure also includes a charge generation layer (CGL) with a reflective portion, the CGL on the first light-emitting layer, the reflective portion having a transmission rate for light emitted by the first light-emitting layer; a second light-emitting layer on the CGL with one or more light-emitting portions for emitting the blue light; and a second electrode layer with a reflectivity on the second light-emitting layer.

Optionally, the OLED structure includes a microcavity structure having the CGL, the second electrode layer, and the second light-emitting layer.

Optionally, wherein the reflective portion in the CGL includes a metal layer.

Optionally, the CGL includes an electron injection layer (EIL) and a hole injection layer (HIL), the EIL containing the metal layer.

Optionally, the EIL is made of Al and LiF; and the HIL is made of NPB(N,N'-bis(1-naphthyl)-N,N'-diphenyl-1,1'-biphenyl-4,4'-diamine) doped with $MoO_3$.

Optionally, the EIL includes an Al layer having a thickness of about 10-20 nm.

Optionally, the first light-emitting layer includes a green light-emitting portion for emitting green light and a red light-emitting portion for emitting red light.

Optionally, the green light-emitting portion and the red light-emitting portion include at least a light-emitting material with a broad full width at half maximum (FWHM).

Optionally, the green light-emitting portion emits light containing blue light or light close to blue light.

Optionally, the first electrode layer is an anode layer and the second electrode layer is a cathode layer.

Optionally, the first electrode layer is made of indium tin oxide (ITO), and the second electrode layer is made of Al with a thickness of about 300 nm.

Optionally, the OLED structure further includes a first carrier transport layer between the first light-emitting layer and the first electrode layer; and a second carrier transport layer between the first light-emitting layer and the CGL.

Optionally, the OLED structure further includes a third carrier transport layer between the second light-emitting layer and the CGL; and a fourth carrier transport layer between the second light-emitting layer and the second electrode layer.

Optionally, the second light-emitting layer includes a blue light-emitting portion for emitting a first portion of the blue light.

Optionally, a portion of light emitted by the first light-emitting layer transmits through the CGL into the microcavity structure.

Optionally, a portion of the green light and a portion of the red light transmit into the microcavity to be converted into a second portion of blue light.

Optionally, the first portion of blue light, the second portion of blue light, the green light, and the red light are mixed to generate white light.

Another aspect of the present disclosure provides a method for fabricating an organic light-emitting diode (OLED) structure, comprising providing a substrate with a thin-film transistor layer on the substrate, the substrate being substantially transparent; forming a first electrode layer on the substrate, the first electrode layer being substantially transparent; and forming a first light-emitting layer on the first electrode layer with one or more light-emitting portions for emitting light for compensating blue light. The method also includes forming a charge generation layer (CGL) with a reflective portion on the first light-emitting layer, the reflective portion has a transmission rat for light emitted by the first light-emitting layer; forming a second light-emitting layer on the CGL with one or more light-emitting portions for emitting the blue light; and forming a second electrode layer with a reflectivity on the second light-emitting layer.

Optionally, the first light-emitting layer includes a green light-emitting portion for emitting green light and a red light-emitting portion for emitting red light; and the second light-emitting layer includes a blue light-emitting layer for emitting blue light.

Another aspect of the present disclosure provides a display panel, including the disclosed OLED structure.

Another aspect of the present disclosure provides a display device, including the disclosed display panel.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

One aspect of the present disclosure provides an OLED structure.

Figure 1:
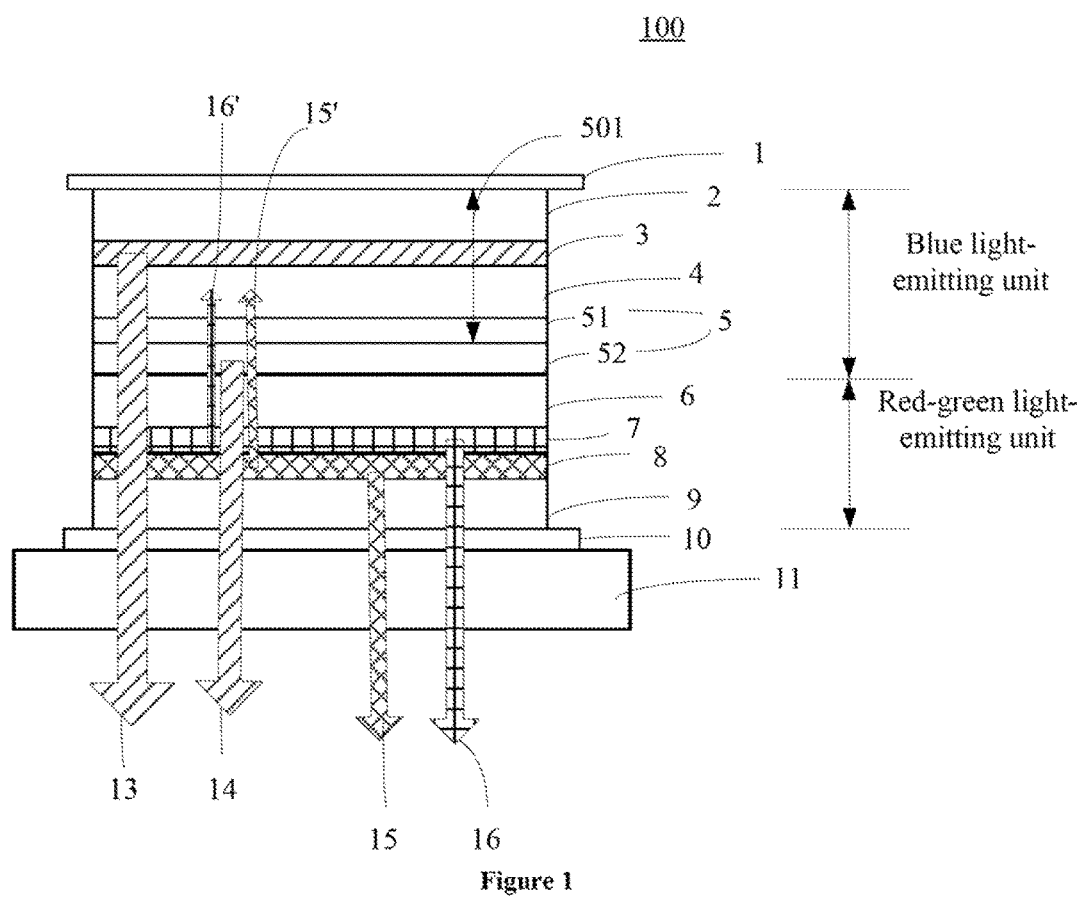
FIG. 1 illustrates an exemplary OLED structure according to the embodiments of the present disclosure.

FIG. 1 illustrates an exemplary OLED structure 100 in embodiments of the present disclosure. The OLED structure 100 may be a tandem bottom-emitting OLED structure for emitting white light. The OLED structure 100 may include a cathode layer or top cathode layer 1, an electron transport layer (ETL) 2, a blue light-emitting layer 3, a hole transport layer (HTL) 4, a charge generation layer (CGL) 5, another ETL 6, a green light-emitting layer 7, a red light-emitting layer 8, another HTL 9, an anode or bottom anode layer 10, and a substrate 11. The CGL 5 may include a hole injection layer (HIL) 51 and an electron injection layer (EIL) 52. A thin-film transistor (TFT) layer (not shown) may be formed between the anode layer 10 and the substrate 11. The TFT layer may include suitable circuits to control and drive the OLED structure 100.

For illustrative purposes, the OLED structure 100 may be viewed as two light emitting units. One may be a blue light-emitting unit and the other may be a red-green light-emitting unit. As shown in FIG. 1, the blue light-emitting unit may be formed on top of the red-green light-emitting unit. The blue light-emitting unit may include the ETL 2, the blue light-emitting layer 3, the HTL 4, the HIL 51 and the EIL 52. The red-green light-emitting unit may include the ETL 6, the green light-emitting layer 7, the red light-emitting layer 8, and the HTL 9.

The cathode layer 1 may be made of any suitable highly reflective metal with relatively low work function, such as Al. In one embodiment, the cathode layer 1 may be made of Al and may have a thickness of about 300 nm to provide sufficient reflection. The anode layer 10 may be made of any suitable conductive and substantially transparent material, such as indium tin oxide (ITO). In one embodiment, the cathode layer 1 may be made of Al, the anode layer 10 may be made of ITO, and the substrate 11 may be made of a substantially transparent material, such as glass.

The anode layer 10 may be formed on the substrate 11. The HTL 9 may be formed on the anode layer 10. The red light-emitting layer 8 may be formed on the HTL 9 and the green light-emitting layer 7 may be formed on the red light-emitting layer 8. The ETL 6 may be formed on the green light-emitting layer 7. The EIL 52 of the CGL 5 may be formed on the ETL 6, and the HIL 51 of the CGL 5 may be formed on the EIL 52. The HTL 4 may be formed on the HIL 51 of the CGL 5. The blue light-emitting layer 3 may be formed on the HTL 4. The ETL 2 may be formed on the blue light-emitting layer 3. The cathode layer 1 may be formed on the ETL 2. It should be noted that, the positions of the cathode layer 1 and the anode layer 10 may switch and should not be limited by the embodiment herein. Further, the electrode layer close to the blue light-emitting layer 3 may have substantially high reflectivity. The electrode layer where the light exits the OLED structure 100 should be substantially transparent.

The blue light-emitting layer 3, the red light-emitting layer 8, and the green light-emitting layer 7 may each be formed by a suitable organic material, such as organic dyes, to emit blue light, red light, and green light, respectively. The green light-emitting layer 7 may be formed by an organic light-emitting material with a sufficiently broad full width at half maximum (FWHM) such as $Alq_3$ and $Ir(ppy)_3$. The sufficiently broad FWHM material may facilitate a desired portion of light emitted by the green light-emitting layer 7 with shorter wavelengths, which may be close to or correspond to blue light. In other words, the green light-emitting layer 7 may emit some blue light or some light with the light color close to blue. Similarly, the red light-emitting layer 8 may also emit a portion of light with wavelengths corresponding to blue light. The portions of light emitted by the green light-emitting layer 7 and the red light-emitting layer 8 with wavelengths corresponding to blue light may be enhanced to blue light with a narrower spectrum range.

The ETL 2 and the ETL 6 may be formed by any suitable material for assisting the transportation of electrons such as $Alq_3$ (tris(8-hydroxyquinolinato)aluminum). The HTL 4 and the HTL 9 may be made of any suitable material for assisting the transportation of holes such as NPB (N,N'-bis(1-naphthyl)-N,N'-diphenyl-1,1'-biphenyl-4,4'-diamine). The HIL 51 of the CGL 5 may be made of NPB doped with $MoO_3$, and the EIL 52 of the CGL 5 may be made of LiF/Al. The CGL 5 may contain a highly reflective metal layer, such as an Al layer. The metal-containing CGL 5 may form an enhancing microcavity 501 with the cathode layer 1. The metal layer contained in the EIL 52 may be semitransparent and the thickness of the metal layer may be about 10 to 20 nm. The thickness of the EIL 52, made of LiF/Al, may be adjusted to further change or adjust the cavity length of the enhancing microcavity 501 so as to adjust the resonance strength of the enhancing microcavity 501. The thickness of the metal layer contained in the EIL 52 may be adjusted to control the ratio of the green light and the red light, which are emitted from the green light-emitting layer 7 and the red light-emitting layer 8, entering the enhancing microcavity 501.

The red-green light-emitting unit may be used to emit red light and green light. The blue light-emitting unit may be used to emit blue light. The blue light, green light, and red light may be mixed together so that the OLED structure 100 may emit white light. The emitted white light may exit from the transparent anode layer 10 and the transparent substrate 11, i.e., the bottom substrate.

In operation, a bias may be applied across the cathode layer 1 and the anode layer 10. Electrical field may be formed between the cathode layer 1 and the anode layer 10. Holes may be generated in the anode layer 10 and the HIL 51. Electrons may be generated in the cathode layer 1 and the EIL 52. The HTL 4 may facilitate the transportation of the holes generated in the HIL 51. The ETL 2 may facilitate the transportation of the electrons generated in the cathode layer 1. The transported electrons and holes may recombine in the blue light-emitting layer 3, and blue light 13 may be emitted. Also, the HTL 9 may facilitate the transportation of the holes generated in the anode layer 10 and the ETL 6 may facilitate the transportation of electrons generated in the EIL 52. The transported electrons and holes may recombine in the green light-emitting layer 7 and the red light-emitting layer 8. Green light 16 and red light 15 may be emitted from the green light-emitting layer 7 and the red light-emitting layer 8, respectively.

The blue light-emitting layer 3 may emit blue light directly. A portion of the directly emitted blue light may exit the CGL 5 and the rest of the OLED structure 100 to enter the user's eyes facing the substrate 11. The directly emitted blue light may be labeled as 13 in FIG. 1. Another portion of the directly emitted blue light may be reflected back and forth by the two reflective layers, i.e., cathode layer 1 and the CGL 5. The reflected blue light may form a portion of the indirectly emitted blue light 14 in FIG. 1, described as follows.

Because the metal layer contained in the EIL 52 is semitransparent, a portion of the green light 16' and a portion of the red light 15' may penetrate the CGL 5 and enter the HTL 4, the blue light-emitting layer 3, and the ETL 2. As described above, the CGL 5 may contain a highly-reflective metal layer, and the cathode layer 1 may be made of highly-reflective metal, the ETL 2, the blue light-emitting layer 3, and the HTL 4, the cathode layer 1, and the HIL 51 may form an enhancing microcavity 501, as shown in FIG. 1. According to the working principles of microcavities, the portion of the green light 16' and the portion of the red light 15' entering the enhancing microcavity 501, together with the portion of blue light reflected by the two reflective layers, may form a standing wave (not shown) between the cathode layer 1 and the HIL 51. The standing wave may have a wavelength substantially corresponding to blue light 14. That is, the portions of green light 16' and red light 15' entering the enhancing microcavity 501, together with some reflected blue light may be converted to blue light 14. The position of the blue light-emitting layer 3 in the enhancing microcavity 501 may correspond to the anti-node of the standing wave to enhance the emission of blue light 14. The blue light 14 formed by the standing wave may be combined with the blue light 13 emitted by the blue light-emitting layer 3. Blue light 13 and 14 may transmit through the CGL 5 together. The transmitted blue light, 13 and 14, may be mixed with the green light 16 and red light 15 to further form white light.

That is, the blue light emitted by the OLED structure 100 may include two portions. One portion may be the blue light 13 generated by the blue light-emitting layer 3 positioned in the enhancing microcavity 501. The other portion may include the blue light 14 generated from the portions of the green light 16' and the red light 15' entering the enhancing microcavity 501, and the blue light reflected by the substrate 11, anode layer 10, and the layers in the red-green light emitting unit. The blue light 13 and the blue light 14 may both exit from the CGL 5. The blue light emitted by the OLED structure 100 may have a higher intensity. Further, because the green light-emitting layer 7 and the red light-emitting layer 8 often have longer service time than the blue light-emitting layer 3, the conversion of portions of the green light 16' and red light 15' to blue light 14 may compensate for degradation of the blue light-emitting layer 3, extending the service time of the OLED structure 100.

Specifically, the green light-emitting layer 7 and the red light-emitting layer 8 may emit light of shorter wavelengths, which may correspond to near-blue light or blue light. For example, the green light-emitting layer 7 may be formed with a material with a broad FWHM and may have light emission below the wavelength of 480 nm. Light of the shorter wavelengths, for example, blue light, may enter the enhancing microcavity 501 and be enhanced by the microcavity 501. The enhanced light may have a sharper peak centering a wavelength corresponding to a blue light.

The cavity length of the enhancing microcavity 501 may be adjusted for emission of blue light. In this case, the cavity length may correspond to the total thicknesses of the ETL 2, the blue light-emitting layer 3, and the HTL 4, and the HIL 51. The thickness of the metal layer contained in the EIL 52 may be between about 10 nm to about 20 nm to allow desired portions of the green light 16' and red light 15' to enter the enhancing microcavity 501.

For example, a thicker metal layer may allow less light from entering the enhancing microcavity 501. That is, less green light 16' and red light 15' may be converted to blue light 14. For a metal layer of 10 nm, the light transmission rate may be about 40%. In one embodiment, the cavity length of the enhancing microcavity 501 may be about 240 nm and the metal layer may be about 10 nm. The thickness of the metal layer can thus be adjusted to enable a desired portion of green light 16' and a desired portion of red light 15' to enter the enhancing microcavity 501. A desired intensity of blue light 14 can be formed. The cavity length of 240 nm may enhance light having a centering wavelength of about 480 nm. The enhanced blue light, for example, the blue light 14 in FIG. 1, may have substantially the same centering wavelength as the blue light 13, emitted by the blue light-emitting layer 3. The blue light 13 and the blue light 14 may also have close but different centering wavelengths, which may still be in the spectrum range of blue light. The differences of centering wavelengths between the blue light 13 and blue light 14 may be adjusted by adjusting the cavity length of the enhancing microcavity 501. The color (e.g., a lighter blue or a deeper blue) of the combined blue light may thus be adjusted.

The condition for forming the standing wave or blue light 14 may be further explained through equation (1).

$$\frac{\varphi_{anode} + \varphi_{cathode}}{2} - \frac{2\pi L \cos\theta}{\lambda} = m\pi \qquad (1)$$

In equation (1), $\varphi_{anode}$ may represent the phase change of light when transmitting through the anode layer of the enhancing microcavity 501. In this case, the anode layer of the enhancing microcavity 501 may be the HIL 51. $\varphi_{cathode}$ may represent the phase change of light while transmitting through the cathode layer of the enhancing microcavity 501. In this case, the cathode layer of the enhancing microcavity 501 may be the cathode layer 1.

$$\frac{\varphi_{anode} + \varphi_{cathode}}{2}$$

may be the total phase change of light transmitting through and reflected back by the two reflective layers, i.e., the cathode layer 1 and the HIL 51. L may represent the optical path of the enhancing microcavity 501. λ may represent the enhanced or resonated standing wavelength. m may be an integer.

$$\frac{2\pi L\cos\theta}{\lambda}$$

may represent the phase change when the light, having an angle of θ with the vertical direction, travels through the optical path L.

$$\left(\frac{\varphi_{anode} + \varphi_{cathode}}{2} - \frac{2\pi L\cos\theta}{\lambda}\right)$$

may represent the phase difference between the light directly transmitting through the HIL 51 and the light reflected by the two reflective layers (cathode layer 1 and HIL 51) of the enhancing microcavity 501. When the phase difference is an integer multiply of π, the light, i.e., the standing wave, of wavelength λ may be enhanced. In this case, the enhanced wavelength λ may be the center wavelength of blue light 14.

Thus, by using the disclosed tandem OLED structure 100, the blue light, including a portion converted from the green light and red light with long service times, may have improved service time. By compensating the intensity of blue light with portions of the generated green light and red light, the intensity and service time of blue light can be increased, and chromaticity coordinates can be improved.

The OLED structure 100 shown in FIG. 1 may be a display unit or a display pixel. In some embodiments, the OLED structure 100 may be used in a display panel. Optionally, a color filter (CF) substrate (not shown) may be formed between the anode layer 10 and the substrate 11. The white light emitted from the OLED structure 100 may transmit through the CF substrate such that different colors, such as the three primary colors, red, green, and blue, may be generated and used in adjusting the colors displayed by the display pixel.

It should be noted that, for illustrative purposes and viewing simplicity, light emitted from different light-emitting layers and/or the enhancing microcavity may be represented by arrows. The direction of an arrow represents an exemplary transmission direction of light emitted from a light-emitting layer and does not reflect all the actual transmission directions of the light. Also, the location of the arrow is only for illustrative purposes and does not reflect the actual transmission location of light emitted from a light-emitting layer. For example, the green light 16 emitted from the green light-emitting layer 7 may emit green light along an upward direction into the enhancing microcavity 501 and along a downward direction exiting the OLED structure 100. The green light 16 may be throughout the entire green light-emitting layer 7. The green light 16' may represent the portion of the green light emitted by the green light-emitting layer 7 and entering the enhancing microcavity 501.

Another aspect of the present disclosure provides a method for fabricating an OLED structure.

Figure 2:
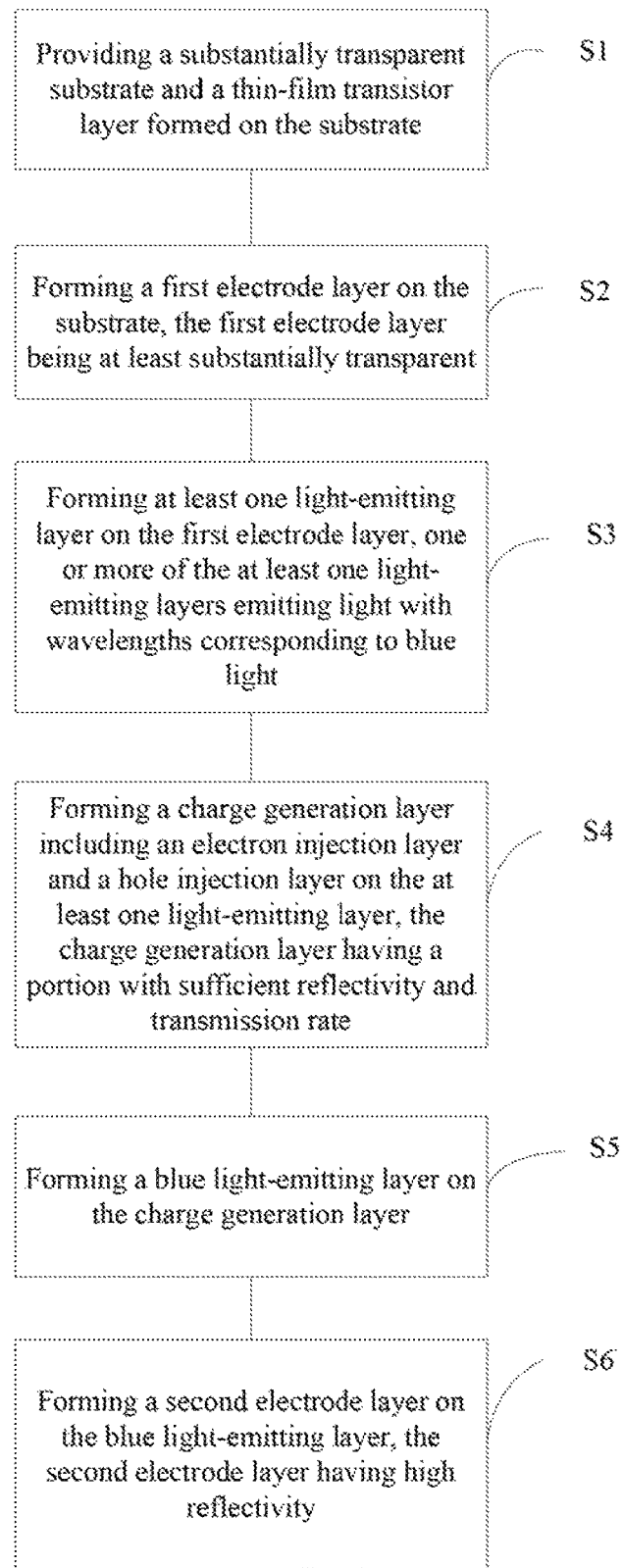
FIG. 2 illustrates an exemplary process flow for fabricating the OLED structure according to the disclosed embodiments of the present disclosure.

FIG. 2 illustrates an exemplary process for forming the OLED structure disclosed in FIG. 1. The process may include steps S1 to S6.

In step S1, a substantially transparent substrate and a thin-film transistor (TFT) layer formed on the substrate are provided.

Referring to FIG. 1, the substrate 11 and a TFT layer formed on the substrate 11 (not shown) may be provided. The substrate 11 may be made of any suitable substantially transparent material, such as glass. The TFT layer may include proper circuits to control and drive the subsequently formed OLED structure 100.

In step S2, a first electrode layer is formed on the substrate, the first electrode layer being at least substantially transparent.

Referring to FIG. 1, the electrode layer may be formed on the substrate 11. The first electrode layer may be substantially transparent. In one embodiment, the first electrode layer may be the anode layer 10 and may be made of indium tin oxide (ITO).

Optionally, a first carrier transport layer may be formed on the first electrode layer. As shown in FIG. 1, in one embodiment, the first carrier transport layer may be a hole transport layer (HTL) 9.

In step S3, at least one light-emitting layer may be formed on the first electrode layer or the first carrier transport layer, one or more of the at least one light-emitting layer emitting light with wavelengths corresponding to blue light.

Referring to FIG. 1, light-emitting layers may be formed on the anode layer 10 and the HTL 9. In one embodiment, light-emitting layers may be a green light-emitting layer 7 and a red light-emitting layer 8. The green light-emitting layer 7 may be formed on the red light-emitting layer 8. The green light-emitting layer 7 and the red light-emitting layer 8 may be made of any suitable organic materials such as organic dyes. The green light-emitting layer 7 may emit green light 16, and the red light-emitting layer 8 may emit red light 15.

Specifically, the green light-emitting layer 7 may be made of an organic material capable of emitting light of broad full width at half maximum (FWHM). The material of the green light-emitting layer 7 may emit light with wavelengths corresponding to blue light, such as wavelengths below 480 nm.

Optionally, a second carrier transport layer may be formed on the at least one light-emitting layer. As shown in FIG. 1, in one embodiment, the second carrier transport layer may be an electron transport layer (ETL) 6, formed on the green light-emitting layer 7.

In step S4, a charge generation layer (CGL) including an electron injection layer (EIL) and a hole injection layer (HIL) are formed on the at least one light-emitting layer, the CGL having a portion with sufficient reflectivity and transmission rate.

Referring to FIG. 1, the CGL 5 may be formed on the at least one light-emitting layer. In one embodiment, the CGL 5 may include an EIL 52 and an HIL 51 formed on the EIL 52. In operation, the EIL 52 and the HIL 51 may be used to generate electrons and holes, respectively.

The EIL 52 of the CGL 5 may contain Al/LiF. The Al may be a thin layer of about 10 nm to about 20 nm. The Al layer may allow a portion of the light emitted by the green light-emitting layer 7 and the red light-emitting layer 8 to transmit through the CGL 5. In one embodiment, the Al layer may have a thickness of 10 nm and a transmission rate of about 40%.

Optionally, a third carrier transport layer may be formed on the CGL. In one embodiment, as shown in FIG. 1, the third carrier transport layer may be the HTL 4.

In step S5, a blue light-emitting layer may be formed on the CGL.

Referring to FIG. 1, the blue light-emitting layer 3 may be formed on the CGL 5. The blue light-emitting layer 3 may be made of any suitable organic materials such as organic dyes. The blue light-emitting layer 3 may emit blue light 13. A portion of the blue light 13 may exit directly from the CGL 5 and transmit to the user's eyes in front of the substrate 11. Another portion of the blue light 14 may be reflected back and forth between the CGL 5 and the subsequently formed second electrode layer to be enhanced. The enhanced blue light may also exit from the CGL 5 and transmit to the user's eyes in front of the substrate 11.

Optionally, a fourth carrier transport layer may be formed on the blue light-emitting layer. In one embodiment, as shown in FIG. 1, the fourth carrier transport layer may be the ETL 2.

In step S6, a second electrode layer may be formed on the blue light-emitting layer. The second electrode layer may have high reflectivity.

Referring to FIG. 1, the second electrode layer may be formed on the blue light-emitting layer 3. In one embodiment, the second electrode layer may be the cathode layer 1 and may be made of Al, with a thickness of about 300 nm.

The second electrode layer and the EIL 52 may form two reflective layers of an enhancing microcavity 501. The EIL 52 may include a sufficiently thin Al layer, allowing a desired portion of the green light 16' and a desired portion of the red light 15' emitted to enter the enhancing microcavity 501. Light with wavelengths corresponding to blue light in the entering green light and red light may be enhanced to blue light 14 centering a certain wavelength. The enhanced blue light 14, together with the enhanced portion of the blue light 13, may exit from the CGL 5 and transmit to the user's eyes in front of the substrate 11.

In one embodiment, the cavity length of the enhancing microcavity 501 may be 240 nm. The microcavity may enhance light of the wavelength of 480 nm. The cavity length of the enhancing microcavity 501 may refer to the length between the cathode layer 1 and the EIL 52. The thickness of the Al layer may be controlled between about 10 nm to about 20 nm for a desired transmission rate and a desired proportion of green light to red light entering the enhancing microcavity 501. In one embodiment, the Al layer may be 10 nm thick and the transmission rate of the Al layer may be 40%.

The ETL 2 and the ETL 6 may be formed by any suitable material for assisting the transportation of electrons such as Alq$_3$ (tris(8-hydroxyquinolinato)aluminum). The HTL 4 and the HTL 9 may be made of any suitable material for assisting the transportation of holes such as NPB (N,N'-bis(1-naphthyl)-N,N'-diphenyl-1,1'-biphenyl-4,4'-diamine). The HIL 51 of the CGL 5 may be made of NPB doped with MoO3, the EIL 52 of the CGL 5 may be made of LiF/Al.

It should be noted that, the second electrode layer may also be an anode layer and the first electrode layer may also be a cathode layer. The second electrode layer has high reflectivity. The first electrode layer has high transparency. The specific arrangement of the anode layer and the cathode layer may be subject to different applications and/or designs.

It should also be noted that, the number of light-emitting layers in the disclosed embodiments are only exemplary. In practice, a different number of light-emitting layers with longer service times may also be used to compensate or enhance a different number of light-emitting layers with shorter service times using the disclosed structure and similar fabrication methods. The specific number of light-emitting layers should not be limited by the embodiments of the present disclosure.

By using the disclosed method, an OLED structure for emitting white light can be formed. The blue light emitted by the OLED structure may include two portions, one from the emission of a blue light-emitting layer, the other from the conversion of portions of green light and red light emitted by the OLED structure and a portion of the emitted blue light reflected by the reflective ends. Because portions of the green light and red light, with considerably long service time, are used to form blue light for compensating the undesirably short service time of conventional blue light, the blue light emitted by the OLED structure may have increased service time. The OLED may have an improved service time and an improved chromaticity coordinates. Further, the intensity of the blue light emitted by the OLED structure may be improved.

Another aspect of the present disclosure provides a display panel.

The disclosed OLED structure may be arranged repeatedly along the horizontal direction and the vertical direction to form a display panel. The display panel may include a plurality of the disclosed OLED arranged in an array.

Another aspect of the present disclosure provides a display device.

The display device may incorporate the display panel described above. The display device according to the embodiments of the present disclosure can be used in any product with display functions such as a television, an LCD display, an OLED display, an electronic paper, a digital photo frame, a mobile phone, a tablet computer, a navigation device, etc.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. An organic light-emitting diode device (OLED) structure for compensating blue light emission, comprising:
   a substrate with a thin-film transistor (TFT) layer, the substrate being substantially transparent;
   a first electrode layer on the substrate, the first electrode being substantially transparent;
   a first light-emitting layer on the first electrode layer with one or more light-emitting portions for emitting light for compensating blue light;
   a charge generation layer (CGL) with a reflective portion, the CGL being on the first light-emitting layer, the reflective portion of the CGL having a transmission rate for light emitted by the first light-emitting layer;
   a second light-emitting layer on the CGL with one or more light-emitting portions for emitting the blue light; and
   a second electrode layer with a reflectivity on the second light-emitting layer, wherein:
   the OLED structure includes a microcavity structure having the CGL, the second electrode layer, and the second light-emitting layer;
   the first light-emitting layer includes a green light-emitting portion for emitting green light and a red light-emitting portion for emitting red light; and
   a portion of the green light and a portion of the red light transmit into the microcavity to be converted into a second portion of blue light.

2. The OLED structure according to claim 1, wherein the reflective portion in the CGL includes a metal layer.

3. The OLED structure according to claim 2, wherein the CGL includes an electron injection layer (EIL) and a hole injection layer (HIL), the EIL containing the metal layer.

4. The OLED structure according to claim 3, wherein:
the EIL is made of Al and LiF; and
the HIL is made of NPB(N,N'-bis(1-naphthyl)-N,N'-diphenyl-1,1'-biphenyl-4,4'-diamine) doped with $MoO_3$.

5. The OLED structure according to claim 3, wherein:
the EIL includes an Al layer having a thickness of about 10-20 nm.

6. The OLED structure according to claim 1, wherein the green light-emitting portion and the red light-emitting portion include at least a light-emitting material with a broad full width at half maximum (FWHM).

7. The OLED structure according to claim 6, wherein the green light-emitting portion emits light containing blue light or light close to blue light.

8. The OLED structure according to claim 1, wherein the first electrode layer is an anode layer and the second electrode layer is a cathode layer.

9. The OLED structure according to claim 1, wherein the first electrode layer is made of indium tin oxide (ITO), and the second electrode layer is made of Al with a thickness of about 300 nm.

10. The OLED structure according to claim 1, further including:
a first carrier transport layer between the first light-emitting layer and the first electrode layer; and
a second carrier transport layer between the first light-emitting layer and the CGL.

11. The OLED structure according to claim 1, further including:
a third carrier transport layer between the second light-emitting layer and the CGL; and
a fourth carrier transport layer between the second light-emitting layer and the second electrode layer.

12. The OLED structure according to claim 1, wherein the second light-emitting layer includes a blue light-emitting portion for emitting a first portion of the blue light.

13. The OLED structure according to claim 1, wherein a portion of light emitted by the first light-emitting layer transmits through the CGL into the microcavity structure.

14. A method for fabricating an organic light-emitting diode (OLED) structure, comprising:
providing a substrate with a thin-film transistor layer on the substrate, the substrate being substantially transparent;
forming a first electrode layer on the substrate, the first electrode layer being substantially transparent;
forming a first light-emitting layer on the first electrode layer with one or more light-emitting portions for emitting light for compensating blue light;
forming a charge generation layer (CGL) with a reflective portion on the first light-emitting layer, the reflective portion has a transmission rate for light emitted by the first light-emitting layer;
forming a second light-emitting layer on the CGL with one or more light-emitting portions for emitting the blue light; and
forming a second electrode layer with a reflectivity on the second light-emitting layer, wherein:
the OLED structure includes a microcavity structure having the CGL, the second electrode layer, and the second light-emitting layer;
the first light-emitting layer includes a green light-emitting portion for emitting green light and a red light-emitting portion for emitting red light; and
a portion of the green light and a portion of the red light transmit into the microcavity to be converted into a second portion of blue light.

15. A display panel, including the OLED structure of claim 1.

16. A display device, including the display panel of claim 15.

17. The method for fabricating an organic light-emitting diode (OLED) structure according to claim 14, wherein the green light-emitting portion and the red light-emitting portion include at least a light-emitting material with a broad full width at half maximum (FWHM).

18. The method for fabricating an organic light-emitting diode (OLED) structure according to claim 17, wherein the green light-emitting portion emits light containing blue light or light close to blue light.

19. The method for fabricating an organic light-emitting diode (OLED) structure according to claim 14, wherein a portion of light emitted by the first light-emitting layer transmits through the CGL into the microcavity structure.

20. The method for fabricating an organic light-emitting diode (OLED) structure according to claim 14, wherein the CGL includes an electron injection layer (EIL) and a hole injection layer (HIL), the EIL containing the metal layer.

21. An organic light-emitting diode device (OLED) structure for compensating blue light emission, comprising:
a substrate with a thin-film transistor (TFT) layer, the substrate being substantially transparent;
a first electrode layer on the substrate, the first electrode being substantially transparent;
a first light-emitting layer on the first electrode layer with one or more light-emitting portions for emitting light for compensating blue light;
a charge generation layer (CGL) with a reflective portion, the CGL being on the first light-emitting layer, the reflective portion of the CGL having a transmission rate for light emitted by the first light-emitting layer;
a second light-emitting layer on the CGL with one or more light-emitting portions for emitting the blue light; and
a second electrode layer with a reflectivity on the second light-emitting layer, wherein:
the OLED structure includes a microcavity structure having the CGL, the second electrode layer, and the second light-emitting layer;
the first light-emitting layer includes a green light-emitting portion for emitting green light and a red light-emitting portion for emitting red light; and
the green light-emitting portion and the red light-emitting portion include at least a light-emitting material with a broad full width at half maximum (FWHM).

22. The OLED structure according to claim 21, wherein the green light-emitting portion emits light containing blue light or light close to blue light.

23. An organic light-emitting diode device (OLED) structure for compensating blue light emission, comprising:
a substrate with a thin-film transistor (TFT) layer, the substrate being substantially transparent;
a first electrode layer on the substrate, the first electrode being substantially transparent;
a first light-emitting layer on the first electrode layer with one or more light-emitting portions for emitting light for compensating blue light;
a charge generation layer (CGL) with a reflective portion, the CGL being on the first light-emitting layer, the reflective portion of the CGL having a transmission rate for light emitted by the first light-emitting layer;

a second light-emitting layer on the CGL with one or more light-emitting portions for emitting the blue light; and a second electrode layer with a reflectivity on the second light-emitting layer, wherein:

the OLED structure includes a microcavity structure having the CGL, the second electrode layer, and the second light-emitting layer;

the second light-emitting layer includes a blue light-emitting portion for emitting a first portion of the blue light; and a portion of light emitted by the first light-emitting layer transmits through the CGL into the microcavity structure.

* * * * *